United States Patent
Tao et al.

(10) Patent No.: US 10,685,814 B2
(45) Date of Patent: Jun. 16, 2020

(54) PROCESSING CHAMBER, COMBINATION OF PROCESSING CHAMBER AND LOADLOCK, AND SYSTEM FOR PROCESSING SUBSTRATES

(71) Applicant: Advanced Micro-Fabrication Equipment Inc, Shanghai, Shanghai (CN)

(72) Inventors: Heng Tao, Shanghai (CN); Tuqiang Ni, Shanghai (CN); Qian Wang, Shanghai (CN)

(73) Assignee: ADVANCED MICRO-FABRICATION EQUIPMENT INC. CHINA, Shanghai (CN)

(*) Notice: Subject to any disclaimer, the term of this patent is extended or adjusted under 35 U.S.C. 154(b) by 653 days.

(21) Appl. No.: 14/952,230

(22) Filed: Nov. 25, 2015

(65) Prior Publication Data
US 2016/0351429 A1    Dec. 1, 2016

(30) Foreign Application Priority Data
May 27, 2015    (CN) .......................... 2015 1 0276763

(51) Int. Cl.
| H01L 21/67 | (2006.01) |
| H01L 21/677 | (2006.01) |
| H01J 37/32 | (2006.01) |
| B25J 11/00 | (2006.01) |

(52) U.S. Cl.
CPC .... H01J 37/3244 (2013.01); H01J 37/32889 (2013.01); H01L 21/6719 (2013.01); H01L 21/67161 (2013.01); H01L 21/67201 (2013.01)

(58) Field of Classification Search
CPC .................. H01L 21/67167; H01L 21/67201
USPC .......................................................... 118/719
See application file for complete search history.

(56) References Cited

U.S. PATENT DOCUMENTS

| 6,034,000 A * | 3/2000 | Heyder ............. H01L 21/67778 438/758 |
| 2003/0113188 A1* | 6/2003 | Pool .................. H01L 21/67201 414/217 |
| 2013/0224953 A1* | 8/2013 | Salinas ............. H01L 21/02063 438/689 |
| 2016/0225646 A1* | 8/2016 | Rice .................. H01L 21/67196 |

FOREIGN PATENT DOCUMENTS

WO     WO 2015/066624    *  5/2015  ........... H01L 21/677

* cited by examiner

*Primary Examiner* — Parviz Hassanzadeh
*Assistant Examiner* — Nathan K Ford
(74) *Attorney, Agent, or Firm* — Womble Bond Dickinson (US) LLP; Joseph Bach, Esq.

(57) ABSTRACT

A system for processing substrates having an atmospheric front end and a vacuum main frame, primary processing chambers attached to the main frame, a loadlock positioned between the front end and the main frame, and at least one secondary processing chamber attached to the loadlock.

21 Claims, 4 Drawing Sheets

PROCESSING CHAMBER, COMBINATION OF PROCESSING CHAMBER AND LOADLOCK, AND SYSTEM FOR PROCESSING SUBSTRATES

RELATED APPLICATION

This application claims priority benefit from Chinese Application, Serial Number 201510276763.3, filed on May 27, 2015, the entire content of which is incorporated herein by reference.

BACKGROUND

1. Field

This disclosure relates to systems used in vacuum processing, such as cluster tools used for fabricating semiconductor devices.

2. Related Art

Cluster tools are well known in the semiconductor industry. Such tools can be used for fabricating, e.g., microprocessors, memory circuits, light emitting diodes (LED), flat panel display, etc. With reference to FIG. 1, in such systems the substrates are brought to the system in clean atmospheric environment and are placed in a section of the system generally referred to in the industry as front end, mini environment, or equipment front end module (EFEM), indicated as 50 in FIG. 1. The substrates then need to be transferred into a vacuum environment. This is done by using robot 70 to remove substrates from cassettes 60 and placing them in a chamber that is generally referred to as loadlock 106. The loadlock 106 is positioned between the EFEM 50 and a vacuum chamber that is generally referred to as main frame or transfer chamber 102. A robot 104 is used to remove substrates from the loadlock 106 and place the substrate in one of processing chambers 108a, 108b, 110, and 112a-112c.

The EFEM 50 is maintained in atmospheric pressure, while the main frame 102 is maintained in vacuum. The function of the loadlock 106 is to transfer the substrates from atmospheric pressure into vacuum pressure and vice versa. The loadlock 106 has one gate valve opening to the EFEM 50 and one gate valve opening to the main frame 102. These two gate valves are never opened at the same time. When the EFEM side gate valve is opened, the loadlock 106 is maintained in atmospheric pressure and substrates can be exchanged between the EFEM and the loadlock 106. When the main frame side gate valve is opened, the loadlock 106 is maintained in vacuum pressure and substrates can be exchanged between the mainframe 102 and the loadlock 106. On the other hand, once the substrates enter the mainframe, they can be loaded onto processing chambers via gate valves openings between the mainframe and the respective processing chamber.

3. Problem to be Solved

In some cases it is desirable to perform further processing on the substrate before or after it has been processed by the standard processing chambers. For example, sometimes the substrates have a layer that should be striped after being etched in the processing chamber. Such layer may be, e.g., a photoresist or other mask material. In standard processing the substrate may be removed from the system and sent to another system to be stripped. However, it would be advantageous to perform the further processing prior to removing the substrate from the chamber.

SUMMARY

The following summary is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Various disclosed embodiments provide a system having a main frame and loadlock connected to the main frame. Standard processing chambers are attached to the main frame and have gate valves openings to the main frame to enable transfer of substrates between the main frame and the processing chambers. The system has further processing chambers that are attached either to the main frame or to the loadlock, or to both. The further processing chambers may have openings leading directly to the loadlock. The openings may or may not have gate valves. Also, additional openings with gate valves may be provided between the further processing chambers and the main frame. In some embodiments, a transfer robot is placed inside the loadlock, in addition to the transfer robot provided inside the main frame.

According to specific disclosed embodiments, a combination loadlock/processing chamber is provided. The combination is configured for attachment between an atmospheric front end module and a vacuum main frame. A first gate valve opening is provided on a first side of the loadlock to enable substrate transfer between the front end and the loadlock. A second gate valve opening is provided on a second side of the loadlock, opposite the first side, to enable substrate transfer between the loadlock and the main frame. The loadlock has a third opening on a third side, enabling transfer of substrates directly between the loadlock and the processing chamber.

According to some disclosed embodiments, a processing chamber is provided, wherein the processing chamber is configured to be integrated with a loadlock. The processing chamber comprises a vacuum enclosure having an opening leading directly to interior volume of the loadlock, thereby enabling exchange of substrates directly between the loadlock and the processing chamber. The processing chamber may further comprise a gate valve opening leading directly to a main frame, enabling exchange of substrates directly between the processing chamber and the main frame. The processing chamber may further comprise a plasma applicator, configures to enable plasma processing inside the vacuum enclosure.

According to further disclosed embodiments, a unitary arrangement having integrated loadlock/processing chamber is provided. The unitary arrangement is configured for attachment between an atmospheric front end module and a vacuum main frame. The unitary arrangement comprises a single body, made out of a single metal block, e.g., aluminum. The single body having a first cavity forming a loadlock and a second cavity forming a processing chamber. The first cavity having first gate valve opening, which is provided on a first side of the cavity to enable substrate transfer between a front end module and the first cavity. A second gate valve opening is provided on a second side of the first cavity, opposite the first side, to enable substrate transfer between the cavity and a main frame. A mutual opening is provided between the first cavity and the second cavity, enabling transfer of substrates directly between the first and second cavities.

Other features and advantages of the disclosed invention will become apparent from the detailed description provided below, relating to exemplary embodiments.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

DETAILED DESCRIPTION

Embodiments of the invention described herein provide several advantages over prior methods and apparatus for vacuum processing. Most prior art systems have all of the processing chambers connected to the mainframe and have port openings only to the main frame. Thus, when a port gate valve is open, the respective chamber shares the vacuum environment with the main frame. If a "dirty" process is performed inside that chamber, some contamination may flow into the main frame and contaminate other chambers when their gate valve is opened. The embodiments described below include a secondary processing chamber that is attached to the loadlock and may have its port open to the loadlock. Thus, substrates can be loaded and unloaded from the secondary chamber directly to the loadlock, without having to open a gate valve to the main frame. Also, processing and loading/unloading at the secondary processing chamber can be performed independently of the operation of the main robot of the main frame. This may improve overall throughput of the system.

According to embodiments described below, an "auxiliary" or secondary processing chamber is added to a processing system, having a sidewall abutting a sidewall of the loadlock. In certain embodiments, the auxiliary processing chamber and the loadlock are integrated by being formed from a single piece of metal, such as aluminum or stainless steel. In such embodiments, the secondary processing chamber and the loadlock can be said to share a sidewall. The secondary processing chamber may be referred to as an "auxiliary" in that it differs from the standard processing chambers which are attached to the main frame and have communication ports only with the main frame. In contrast, the auxiliary processing chamber is attached to the loadlock and has a communication port to the loadlock, and may or may not have an additional communication port to the main frame. Thus, the secondary processing chamber may be thought of being auxiliary to the main frame. The auxiliary chamber may be a plasma processing chamber and may be used for, e.g., stripping.

Figure 2:
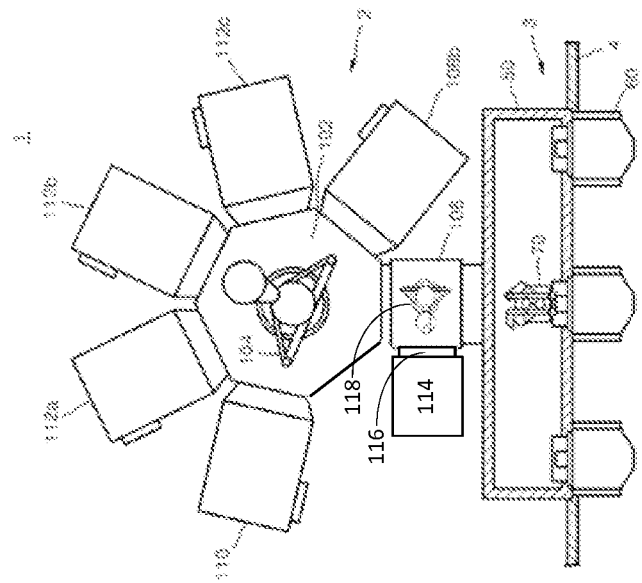
FIG. 2 illustrates a processing system according to an embodiment of the invention.
Figure 1:
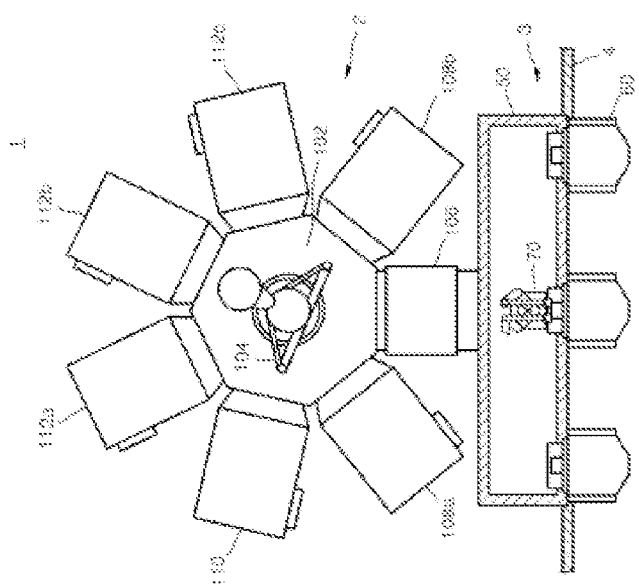
FIG. 1 illustrates a processing system according to the prior art.

FIG. 2 is a schematic diagram of a system according to one embodiment. The system shown in FIG. 2 is largely similar to that shown in FIG. 1, except that it includes a secondary processing chamber 114. In the example of FIG. 2, the secondary chamber 114 is attached to the loadlock 106. A port 116 is provided to enable substrate transfer between the secondary processing chamber 114 and the loadlock 106. Optionally, a transfer robot 118 is provided in the loadlock 106 to perform the substrate exchange between the secondary process chamber 114 and the loadlock 106.

Various disclosed configurations of the processing system disclosed herein enable additional processing either before or after processing by the chambers attached to the main frame. Thus, for example, if a substrate is processed in either of chambers 110, 112a-112c, but needs to be stripped of a mask material, rather than sending the substrate to another system having a stripping chamber, the substrate can be loaded onto secondary chamber 114, which may function as a stripping chamber. For example, after completing processing in, say, chamber 110, the main robot 104 removes the substrate from chamber 110 and delivers it to the loadlock 106. Robot 118 then takes the substrate and delivers it to secondary chamber 114. Meanwhile, main robot 104 can take a fresh substrate from the loadlock 106 and deliver it to chamber 110 for processing.

Figure 3:
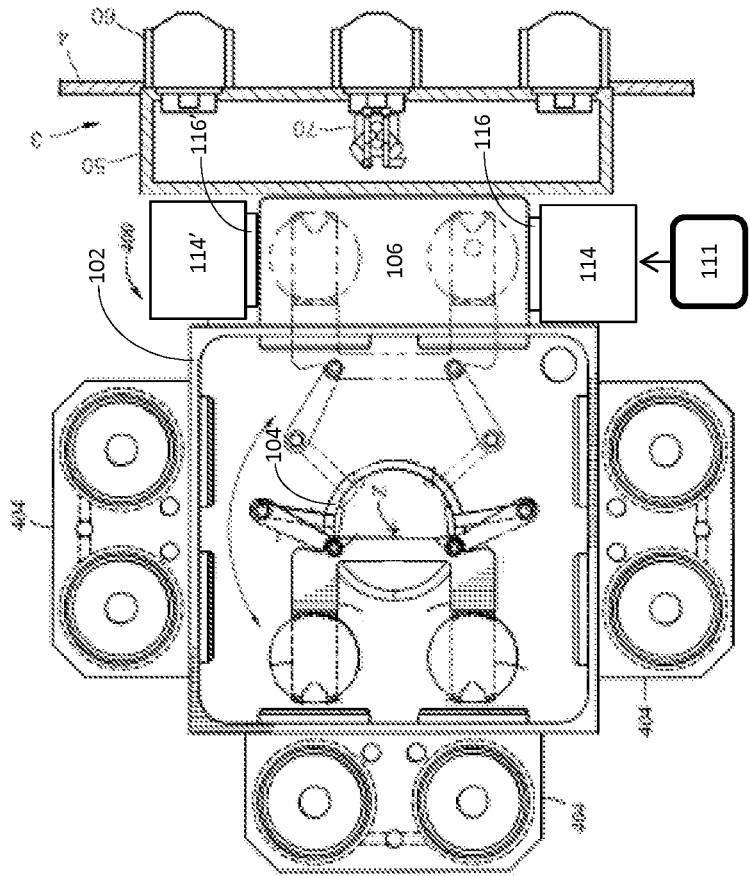
FIG. 3 illustrates a processing system according to another embodiment of the invention.

Referring now to FIG. 3, another embodiment is illustrated, wherein two secondary processing chambers 114, 114' are provided, flanking the loadlock 106 on each side. Each of secondary processing chambers 114 and 114' has an opening 116, 116' to the loadlock 106. The opening may or may not include gate valves, but including gate valve will assist in preventing contamination between the processing chamber and the loadlock. The embodiment of FIG. 3 also illustrates the flexibility of the invention. In this embodiment, dual-substrate processing chambers 404 are used, i.e., each of chambers 404 is capable of processing two substrates simultaneously. Thus, the main robot 104 of main frame 102 is capable of handling two substrates simultaneously. Therefore, in this particular illustration the loadlock 106 is configured to accommodate the robot 104 handling of two substrates simultaneously. However, it should be appreciated that even when dual-substrate chambers are used, the main frame may still accommodate a single substrate robot, like that of FIGS. 1 and 2, such that the loadlock 106 may be narrower and accommodate transfers of single substrate at a time. Such an arrangement is illustrated in FIG. 4.

In the embodiment of FIG. 3 the secondary processing chamber includes a plasma applicator 111. Notably, any of the processing chambers in any of the disclosed embodiments may include plasma applicator. The plasma applicator may be an inductive, capacitive, microwave, etc., designed to sustain plasma within the internal processing volume of the secondary processing chamber. Conversely, the plasma applicator 111 may be a remote plasma source configured to sustain plasma in a chamber remote from the internal processing volume, but to deliver radicals from the plasma into the internal processing volume. The plasma applicator may be used for, e.g., stripping a mask off of the substrates.

Figure 4:
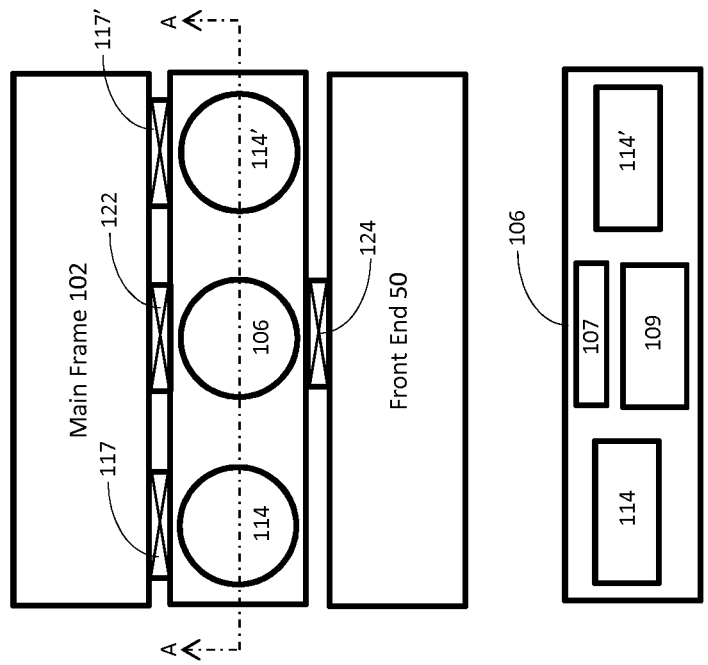
FIG. 4 illustrates a top view and cross section of one embodiment.

FIG. 4 is a simplified schematic showing a top view and a cross section along lines A-A of an embodiment wherein the loadlock 106 accommodates a single arm robot, e.g., a SCARA or a frog-legs robot, and is flanked by two secondary processing chambers 114 and 114'. In this particular example each of the secondary processing chambers has an opening 117, 117' to the main frame 102, although they are physically attached to the load lock and may even be integral to the loadlock 106. In such an embodiment, gate valves should be provided on each of opening 117 and 117'. Consequently, in this particular arrangement the secondary processing chambers 114 and 114' are loaded and unloaded by the robot positioned in the main frame 102. Another gate valve 122 is provided on the port between the loadlock 106 and main frame 102. Gate valve 124 is provided on the port between the loadlock 106 and front end 50.

In this particular example the loadlock is divided into top section 107 and bottom section 109, separated by a partition. In one example one section is used solely for transferring fresh substrates into the main frame 102, while the other section is used solely for transferring processed substrates out to front end 50. For example, the top section 107 may be used only to transfer fresh substrates to main frame 102 for processing. The bottom section 109 may be used solely for handling processed substrates, meaning substrates that have been processed by the main processing chambers and substrates that have been processed by the secondary processing chambers 114 and 114'. Therefore, when ports are provided between loadlock 106 and secondary processing chambers 114, 114' (see embodiments described below), the bottom section 109 may also include a transfer robot (not shown here, but see FIG. 8). Also, in some embodiments the partition enables maintaining the top portion and the bottom portion at different atmospheric or vacuum environments. That is, in such embodiments the partition prevents fluid flow or exchange between the top and bottom sections.

Figure 5:
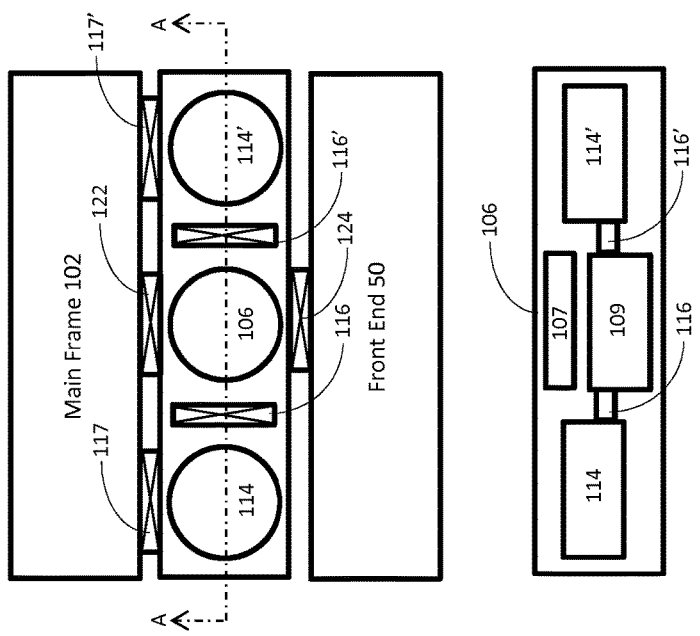
FIG. 5 illustrates a top view and cross section of another embodiment.

FIG. 5 is a simplified schematic showing a top view and a cross section along lines A-A of an embodiment wherein the loadlock 106 accommodates a single arm robot and is flanked by two secondary processing chambers 114 and 114' having ports to exchange substrates therewith. That is, in this particular example each of the secondary processing chambers has opening ports 117, 117' to the main frame 102. However, in addition, each of the secondary processing chambers has an opening ports 116, 116' to the loadlock 106. Consequently, in this particular arrangement the secondary processing chambers 114 and 114' may be loaded and unloaded by the robot positioned in the main frame 102 and by a robot positioned inside the loadlock 106, e.g., inside bottom section 109.

Figure 6:
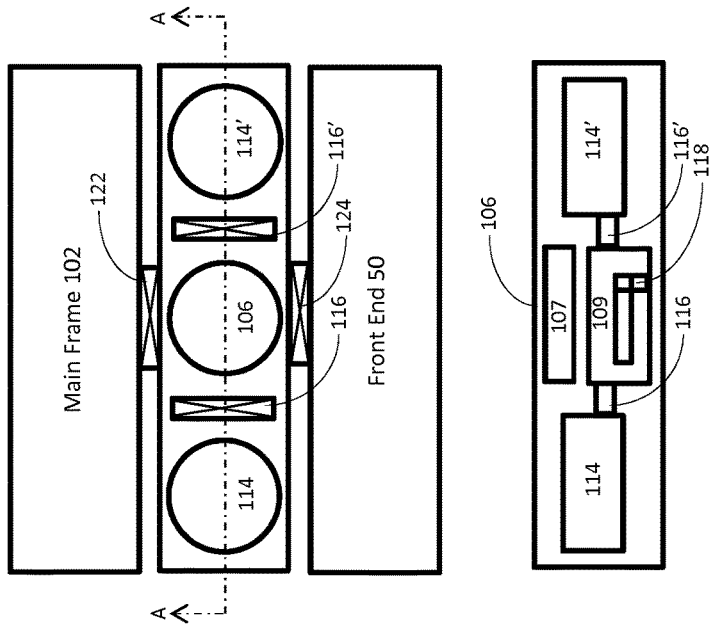
FIG. 6 illustrates a top view and cross section of yet another embodiment.

FIG. 6 is a simplified schematic showing a top view and a cross section along lines A-A of an embodiment wherein the loadlock 106 accommodates a single arm robot 118 and is flanked by two secondary processing chambers 114 and 114' having ports to exchange substrates therewith. That is, in this particular example each of the secondary processing chambers has opening ports 116, 116' to the loadlock 106, but has no ports to the main frame 102. Consequently, in this particular arrangement the secondary processing chambers 114 and 114' may be loaded and unloaded only by the robot 118 inside the loadlock 106, e.g., inside bottom section 109.

Figure 7:
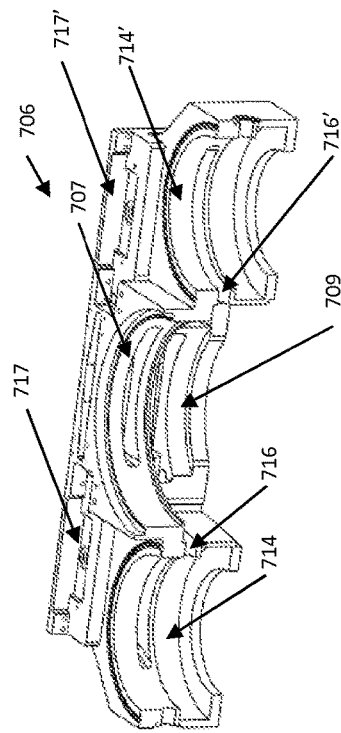
FIG. 7 illustrates an isometric cross section of one embodiment.

FIG. 7 illustrates an isometric cross-section of a unitary body forming an integrated loadlock/processing chambers. In this particular example the bodies of the loadlock and the two flanking processing chambers is milled from a single piece of metal, such as aluminum or stainless steel. As an alternative embodiment, the loadlock and processing chambers can be individual chamber and can be assembled together. This embodiment may be used in any of the disclosed arrangements disclosed herein, except that in this particular example ports 716 and 716' are provided between each of the processing chambers and the loadlock 706. If not required they can be eliminated. Also, in this particular example ports 717 and 717' are provided on each of the processing chambers leading to the main frame 102. If not required they can be eliminated. In this example the top section 707 of the loadlock is used for fresh substrates, while the lower section 709 is used for processed substrates and houses a robot for exchanging substrates between the processing chambers 714, 714' and the loadlock 706.

Figure 8:
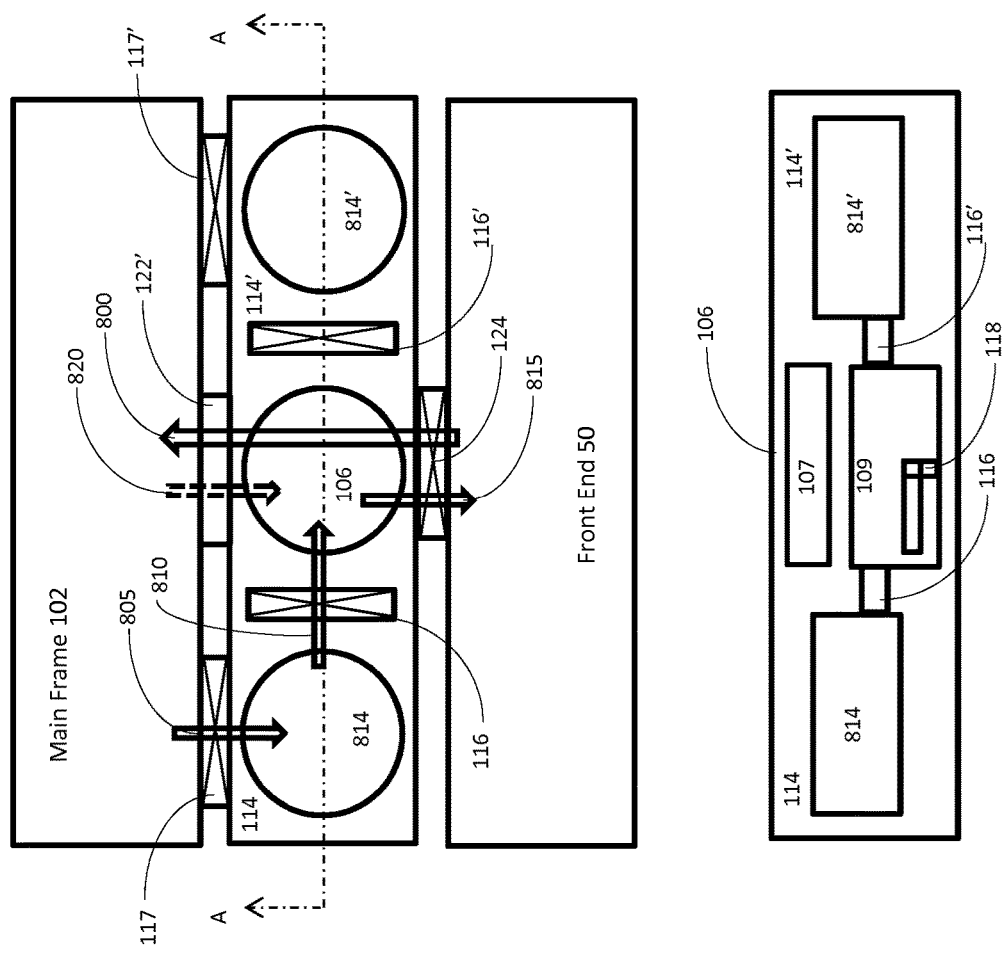
FIG. 8 is a simplified schematic showing a top view and a cross section along lines A-A of an embodiment, and FIG. 8 also exemplifies transfer of wafers between the various system elements.

FIG. 8 is a simplified schematic showing a top view and a cross section along lines A-A of an embodiment wherein the loadlock 106 accommodates a single arm robot 118 and is flanked by two secondary processing chambers 114 and 114' having attachment mechanism (e.g. bolts, threaded holes, and alignment pins) to attach each individual secondary processing chambers 114 and 114' to the loadlock 106. The loadlock 106 and the two secondary processing chambers 114 and 114' are arranged horizontally side-by-side and are positioned between the front end 50 and the main frame 102. The secondary processing chambers may be attached to a sidewall of the loadlock or share a sidewall with the loadlock, while in other embodiments the secondary processing chambers are made integral with the loadlock.

Each individual secondary processing chambers 114 and 114' has a processing zone (814 and 814', respectively) having ports with gate valves (117, 117') mating to respective ports on the main frame 102, configured to enable transfer of wafers from the main frame 102 directly to one of chambers 114 and 114'. Each individual secondary processing chambers 114 and 114' also has a ports with gate valves (116, 116') mating to respective ports on the loadlock 106, configured to enable transfer of wafers between the loadlock 106 and directly with one of chambers 114 and 114'. In this embodiment loadlock 106 has a port 122' mating with the main frame 102. In this particular embodiment port 122' does not have a gate valve. Loadlock 106 also has port 124, with a gate valve, configured to provide access to transfer wafers between the loadlock 106 and the front end 50. The processing zones 814 and 814' may be configured for performing processes such as stripping, cleaning, and ashing. For that purpose, the secondary processing chambers may include plasma applicators, e.g., RF power sources with electrodes to capacitively or inductively couple the RF into the processing zones. Also, the secondary processing chamber may include processing gas delivery mechanism, such as showerheads or gas injectors. Alternatively, the secondary processing chambers may include remote plasma modules, such as microwave or toroidal remote plasma modules, which maintain plasma in a remote module and delivers radicals into the processing zones.

FIG. 8 also exemplifies transfer of wafers between the various system elements. In one example, fresh wafers are transferred into the upper section 107 of loadlock 106. This can be done by the robot 70 positioned in the front end 50. From there the wafer is transferred to the main frame using, e.g., the robot 104 positioned in the main frame 102. These steps are illustrated by arrow 800. The main frame robot places the wafer in one of the main processing chambers (e.g., 112a-112c in FIG. 1) for processing. Once processing is completed the main frame robot may transfer the wafer to another main processing chamber if necessary for further processing. Otherwise, the main frame robot may transfer the wafer to one of the secondary processing chambers, as shown by arrow 805. Once processing is completed inside the secondary processing chamber, the loadlock robot 118 transfers the wafer from the secondary processing chamber and into the bottom section 109 of loadlock 106, as shown by arrow 810. The wafer is then transferred from bottom section 109 into the front end using either loadlock robot 118 or front end robot 70, as illustrated by arrow 815. On occasions where the wafer need not be processed in secondary chamber, the wafer may be transferred from the main frame directly to the bottom section 109 of the loadlock 106, as shown by dotted arrow 820.

In summary, aspects disclosed relate to a processing chamber for processing substrates in a semiconductor processing system having a main frame and a loadlock, the processing chamber comprising: a chamber body defining a processing zone therein, the chamber body having provisions or attachment mechanism for attaching the chamber body to the loadlock; a first port configured for transferring substrates between the processing zone and the main frame; and a second port configured for transferring substrates between the processing zone and the loadlock. A gate valve provided on the first port, on the second port, or on both ports. The chamber body may share a sidewall with the loadlock, may be formed integral to the load lock, or the loadlock and the processing chamber may be formed in a unitary body fabricated from a single piece of metal, by, e.g., milling cavities to form the interiors of the loadlock and processing chamber. The processing chamber may utilize plasma, in which case it would be provided with a plasma applicator.

According to other aspects, a combination of processing chamber and loadlock for processing substrates in a semiconductor processing system having a main frame and an atmospheric front end is provided, the combination comprising: a loadlock chamber having a front port on a front face, configured for transferring substrates between the loadlock and the front end, and a rear port on a rear face, configured for transferring substrates between the loadlock and the main frame; and a processing chamber defining a processing zone therein, the processing chamber abutting a first side of the loadlock chamber, orthogonal to or between the front face and the rear face, the processing chamber further comprising a loading port configured for transferring substrates between the processing zone and the loadlock. A second processing chamber may be provided, abutting a second side of the loadlock chamber opposite the first side, and having a loading port configured for transferring substrates between the second processing chamber and the loadlock. The chamber body of each of the processing chambers may share a sidewall with the loadlock, may be formed integral to the load lock, or the loadlock and the two processing chambers may be formed in a unitary body fabricated from a single piece of metal, by, e.g., milling cavities to form the interiors of the loadlock and the two processing chambers. Each of the two processing chamber may utilize plasma, in which case it would be provided with a plasma applicator. The loading port of each of the processing chambers, may further comprise a gate valve. Also, the loadlock may further comprise a loading robot configured for exchanging substrates between the loadlock and the processing chamber and the second processing chamber.

Yet further aspects provide system for processing substrates, comprising: an atmospheric front end configured to accept and house substrates; a main frame having a main robot and configured to be maintained in vacuum; a plurality of primary processing chambers attached to the main frame, each of the primary processing chambers having a loading port configured for exchanging substrates between the main frame and the processing chamber using the main robot; a loadlock chamber having a front face attached to the front end and a rear face attached to the main frame, the front face having a front port and the rear face having a rear port; and, a secondary processing chamber attached to a side of the loadlock orthogonally to the front face or between the front face or the rear face. The system may further comprise a second secondary processing chamber attached to a second side of the loadlock and having a port to the side of the loadlock, the port configured for exchanging substrates between the secondary processing chamber and the loadlock. A secondary robot may be housed within the loadlock. The secondary processing chamber, the second secondary processing chamber and the loadlock may be fabricated in a single body formed of a single piece of metal. As preferred embodiments, the loadlock comprises a top section and a bottom section and the port or the gate valve of the processing chambers positioned on one side or both sides of the loadlock opens exclusively to either the top or the bottom sections.

Another aspect relates to a method of operating a processing system, comprising the steps of: using a front end robot to load fresh wafers into a loadlock; using a mainframe robot to transfer the wafer from the loadlock to a processing chamber via the mainframe; processing the wafer inside the processing chamber; using the mainframe robot to remove the wafer from the processing chamber and inserting the wafer into a secondary processing chamber; performing a secondary process inside the secondary processing chamber; using a loadlock robot to transfer the wafer from the secondary processing chamber directly into the loadlock; and transferring the wafer out to the front end from the loadlock. The step of transferring the wafer out to the front end may be performed using the front end robot or the loadlock robot. The loadlock may comprise a top section and a bottom section, and the step of using a front end robot to load fresh wafers into a loadlock may be performed so as to transfer the wafer into one of the top and bottom sections, while the step of transferring the wafer out to the front end may be performed from the other one of the top and bottom sections.

It should be understood that processes and techniques described herein are not inherently related to any particular apparatus and may be implemented by any suitable combination of components. Further, various types of general purpose devices may be used in accordance with the teachings described herein. It may also prove advantageous to construct specialized apparatus to perform the method steps described herein. The present invention has been described in relation to particular examples, which are intended in all respects to be illustrative rather than restrictive. Those skilled in the art will appreciate that many different combinations of functional elements will be suitable for practicing the present invention. Moreover, other implementations of the invention will be apparent to those skilled in the art from consideration of the specification and practice of the invention disclosed herein. Various aspects and/or components of the described embodiments may be used singly or in any combination in the relevant arts. It is intended that the specification and examples be considered as exemplary only, with a true scope and spirit of the invention being indicated by the following claims.

The invention claimed is:

1. A combination for processing substrates in a semiconductor processing system having a main frame and an atmospheric front end, the combination comprising:
a main frame having a main robot and configured to be maintained in vacuum;
a loadlock chamber attached directly to the main frame and having a front port with a gate valve on a front face, configured for transferring substrates between the loadlock chamber and the front end under atmospheric pressure, and a rear port with a gate valve on a rear face, configured for transferring substrates between the loadlock chamber and the main frame under vacuum;

a processing chamber attached directly to the main frame and to the loadlock chamber, the processing chamber defining a processing zone therein, the processing chamber abutting a first side of the loadlock chamber, between the front face and the rear face, the processing chamber further comprising a loading port with a gate valve on the first side of the loadlock, configured for transferring substrates between the processing zone and the loadlock chamber through the first side of the loadlock, the processing chamber further comprises a port with a gate valve to the main frame, the port configured for exchanging substrates between the processing chamber and the main frame.

2. The combination of claim 1, further comprising a second processing chamber abutting a second side of the loadlock chamber opposite the first side, and having a loading port on the second side of the loadlock chamber, configured for transferring substrates between the second processing chamber and the loadlock.

3. The combination of claim 2, wherein the processing chamber, the second processing chamber and the loadlock are integral.

4. The combination of claim 2, wherein the processing chamber, the second processing chamber and the loadlock are fabricated over a single body formed of a single piece of metal.

5. The combination of claim 2, wherein each of the processing chamber and the second processing chamber further comprises a respective plasma applicator.

6. The combination of claim 2, wherein the loading port of the second processing chamber further comprises a gate valve.

7. The combination of claim 6, wherein the loadlock comprises a top section and a bottom section and wherein the gate valve of the second processing chamber opens exclusively to either the top or the bottom sections.

8. The combination of claim 2, wherein the loadlock further comprises a loading robot configured for exchanging substrates between the loadlock and the processing chamber and the second processing chamber.

9. The combination of claim 2, wherein the loadlock comprises a top section and a bottom section and further comprising a loading robot positioned in one of the top and bottom sections.

10. A system for processing substrates, comprising:
an atmospheric front end configured to accept and house substrates;
a main frame having a main robot and configured to be maintained in vacuum;
a plurality of primary processing chambers attached directly to the main frame, each of the primary processing chambers having a loading port configured for exchanging substrates between the main frame and the primary processing chamber using the main robot;
a loadlock chamber having a front face attached directly to the front end and a rear face attached directly to the main frame, the front face having a front port with a gate valve and the rear face having a rear port with a gate valve; and,
a secondary processing chamber attached directly to the main frame and to a side of the loadlock between the front face and the rear face;
wherein the secondary processing chamber comprises a port with a gate valve to the side of the loadlock, the port configured for exchanging substrates between the secondary processing chamber and the loadlock, and the secondary processing chamber further comprises a port with a gate valve to the main frame, the port configured for exchanging substrates between the secondary processing chamber and the main frame.

11. The processing system of claim 10, wherein the secondary processing chamber comprises
a chamber body defining a processing zone therein, the chamber body having an attachment mechanism for attaching the chamber body to a sidewall of the loadlock.

12. The processing system of claim 1, wherein the secondary processing chamber further comprises a plasma applicator and processing gas delivery mechanism.

13. The processing system of claim 1, wherein the chamber body shares a sidewall with the loadlock.

14. The processing system of claim 1, wherein the chamber body is formed integral to the loadlock.

15. The processing system of claim 1, wherein the loadlock has a top portion and a bottom portion separated by a partition, and further comprising a robot positioned in one of the top section and bottom section.

16. The system of claim 10, further comprising a second secondary processing chamber attached to a second side of the loadlock.

17. The system of claim 16, wherein the secondary processing chamber, the second secondary processing chamber and the loadlock are fabricated on a single body formed of a single piece of metal.

18. The system of claim 10, further comprising a secondary robot housed within the loadlock.

19. The system of claim 10, further comprising a plasma applicator coupled to the secondary processing chamber.

20. The system of claim 10, wherein the loadlock comprises a top section and a bottom section and further comprising a loading robot positioned in one of the top and bottom sections.

21. The system of claim 10, wherein the loadlock comprises a top section and a bottom section and wherein the port opens exclusively to either the top or the bottom sections.

* * * * *